(12) United States Patent
Kondo

(10) Patent No.: US 11,366,761 B2
(45) Date of Patent: Jun. 21, 2022

(54) MEMORY SYSTEM INCLUDING PARALLEL OPERATION ELEMENTS AND CONTROL METHOD TO REDUCE READ LATENCY AND OMIT STATUS CHECK

(71) Applicant: Kioxia Corporation, Tokyo (JP)

(72) Inventor: Takashi Kondo, Yokohama (JP)

(73) Assignee: Kioxia Corporation, Tokyo (JP)

( * ) Notice: Subject to any disclaimer, the term of this patent is extended or adjusted under 35 U.S.C. 154(b) by 13 days.

(21) Appl. No.: 17/009,940

(22) Filed: Sep. 2, 2020

(65) Prior Publication Data
US 2021/0117335 A1  Apr. 22, 2021

(30) Foreign Application Priority Data

Oct. 21, 2019 (JP) .............................. JP2019-191644

(51) Int. Cl.
*G06F 13/16* (2006.01)
*G06F 3/06* (2006.01)
*G06F 11/10* (2006.01)
*G06F 12/0884* (2016.01)
*G06F 12/0882* (2016.01)
(Continued)

(52) U.S. Cl.
CPC ...... *G06F 12/0884* (2013.01); *G06F 11/0757* (2013.01); *G06F 11/1068* (2013.01); *G06F 11/3037* (2013.01); *G06F 12/0882* (2013.01); *G06F 13/1689* (2013.01); *G06F 3/0611* (2013.01); *G06F 3/0659* (2013.01); *G06F 3/0679* (2013.01)

(58) Field of Classification Search
CPC ............. G06F 12/0884; G06F 11/0757; G06F 11/1068; G06F 11/3037; G06F 12/0882; G06F 13/1689; G06F 3/0659; G06F 3/0673; G06F 3/0679
See application file for complete search history.

(56) References Cited

U.S. PATENT DOCUMENTS 9,146,860 B2  9/2015 Kondo
9,218,284 B2  12/2015 Yoon et al.
2014/0059274 A1  2/2014 Kondo
(Continued)

FOREIGN PATENT DOCUMENTS

JP  2014-041468 A  3/2014

*Primary Examiner* — Charles Rones
*Assistant Examiner* — Hewy H Li
(74) *Attorney, Agent, or Firm* — Oblon, McClelland, Maier & Neustadt, L.L.P.

(57) ABSTRACT

According to one embodiment, a memory system includes a non-volatile memory and a memory controller. The non-volatile memory includes a plurality of parallel operation elements each including a memory cell. The memory controller is configured to control the plurality of parallel operation elements. In reading data from the non-volatile memory, the memory controller is configured to sequentially instruct the plurality of parallel operation elements to perform a sense operation of sensing data stored in the memory cell included in each of the plurality of parallel operation elements. In a case where an operation period of the sense operation of any one of the plurality of parallel operation elements is expired, the memory controller instructs the one of the plurality of parallel operation elements to perform a transfer operation for the data without checking a status of the one of the plurality of parallel operation elements.

19 Claims, 13 Drawing Sheets

(51) Int. Cl.
*G06F 11/30* (2006.01)
*G06F 11/07* (2006.01)

(56) References Cited

U.S. PATENT DOCUMENTS

2016/0292092 A1* 10/2016 Gavens ............... G06F 13/4068
2017/0365335 A1* 12/2017 Wang .................... G06F 3/0659
2018/0075912 A1* 3/2018 Shimizu ................. G11C 16/14
2019/0212918 A1 7/2019 Wang et al.
2019/0227749 A1 7/2019 Wakchaure et al.

* cited by examiner

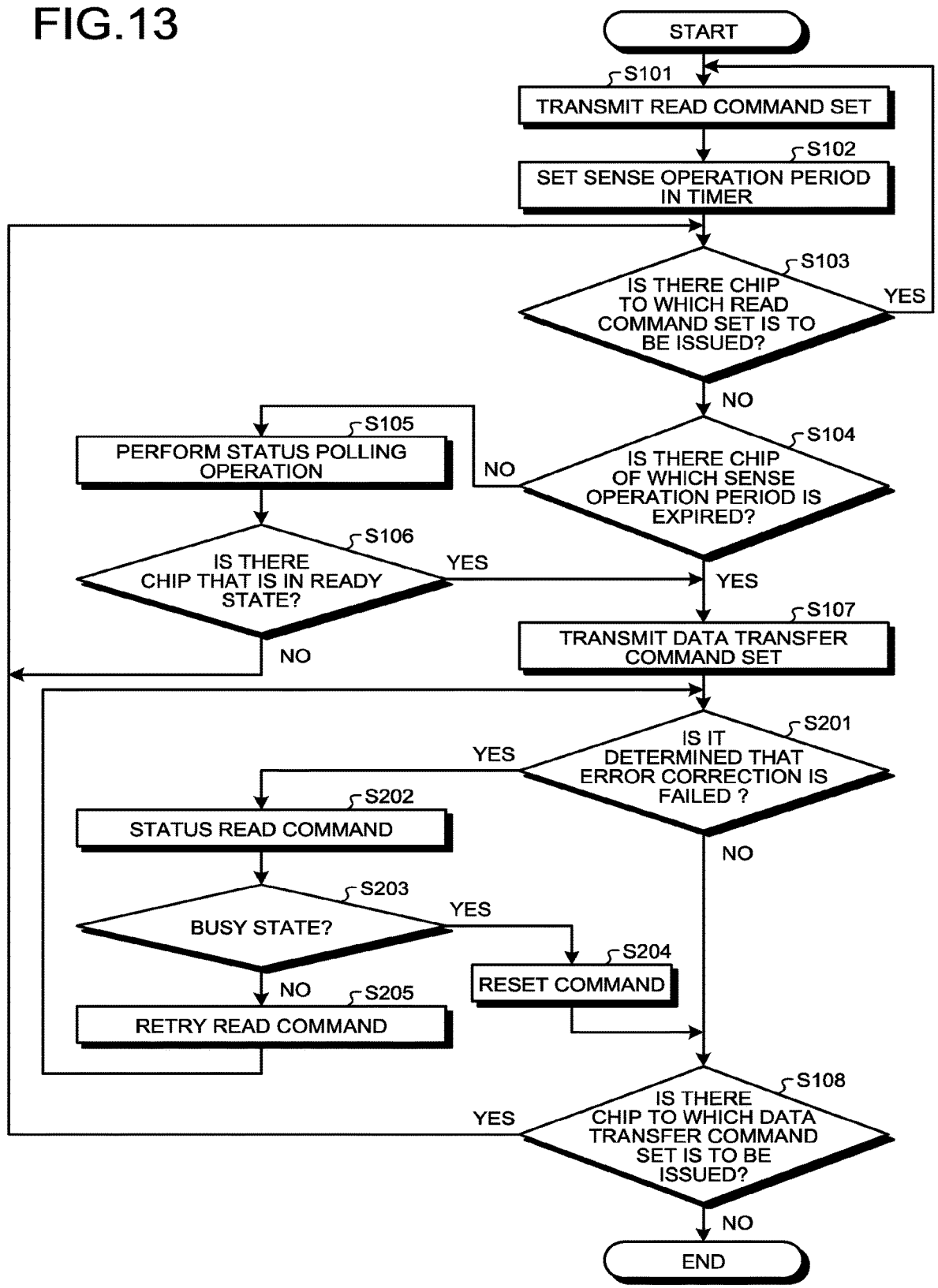

MEMORY SYSTEM INCLUDING PARALLEL OPERATION ELEMENTS AND CONTROL METHOD TO REDUCE READ LATENCY AND OMIT STATUS CHECK

CROSS-REFERENCE TO RELATED APPLICATIONS

This application is based upon and claims the benefit of priority from Japanese Patent Application No. 2019-191644, filed on Oct. 21, 2019; the entire contents of which are incorporated herein by reference.

FIELD

Embodiments described herein relate generally to a memory system and a control method.

BACKGROUND

A memory system includes a memory controller and a memory connected to the memory controller. The memory includes, for example, a plurality of parallel operation elements. The memory controller includes, for example, a plurality of channels, and controls some of the plurality of parallel operation elements per channel.

In such a configuration, the memory controller may check the status of the memory by performing a status polling operation. However, a time required for the status polling operation delays a read operation.

BRIEF DESCRIPTION OF THE DRAWINGS

FIG. 13 is a flowchart illustrating an example of processing when the busy-stack phenomenon occurs in the read operation according to the modified example of the embodiment.

DETAILED DESCRIPTION

In general, according to one embodiment, a memory system includes a non-volatile memory and a memory controller. The non-volatile memory includes a plurality of parallel operation elements each including a memory cell. The memory controller is configured to control the plurality of parallel operation elements. In reading data from the non-volatile memory, the memory controller is configured to sequentially instruct the plurality of parallel operation elements to perform a sense operation of sensing data stored in the memory cell included in each of the plurality of parallel operation elements. In a case where an operation period of the sense operation of any one of the plurality of parallel operation elements is expired, the memory controller instructs the one of the plurality of parallel operation elements to perform a transfer operation for the data without checking a status of the one of the plurality of parallel operation elements.

Exemplary embodiments of the memory system will be explained below in detail with reference to the accompanying drawings. The present invention is not limited to the following embodiments. In addition, components in the following embodiments include those that can be easily assumed by those skilled in the art or those that are substantially the same.

(Example of Configuration of Memory System)

Figure 1:
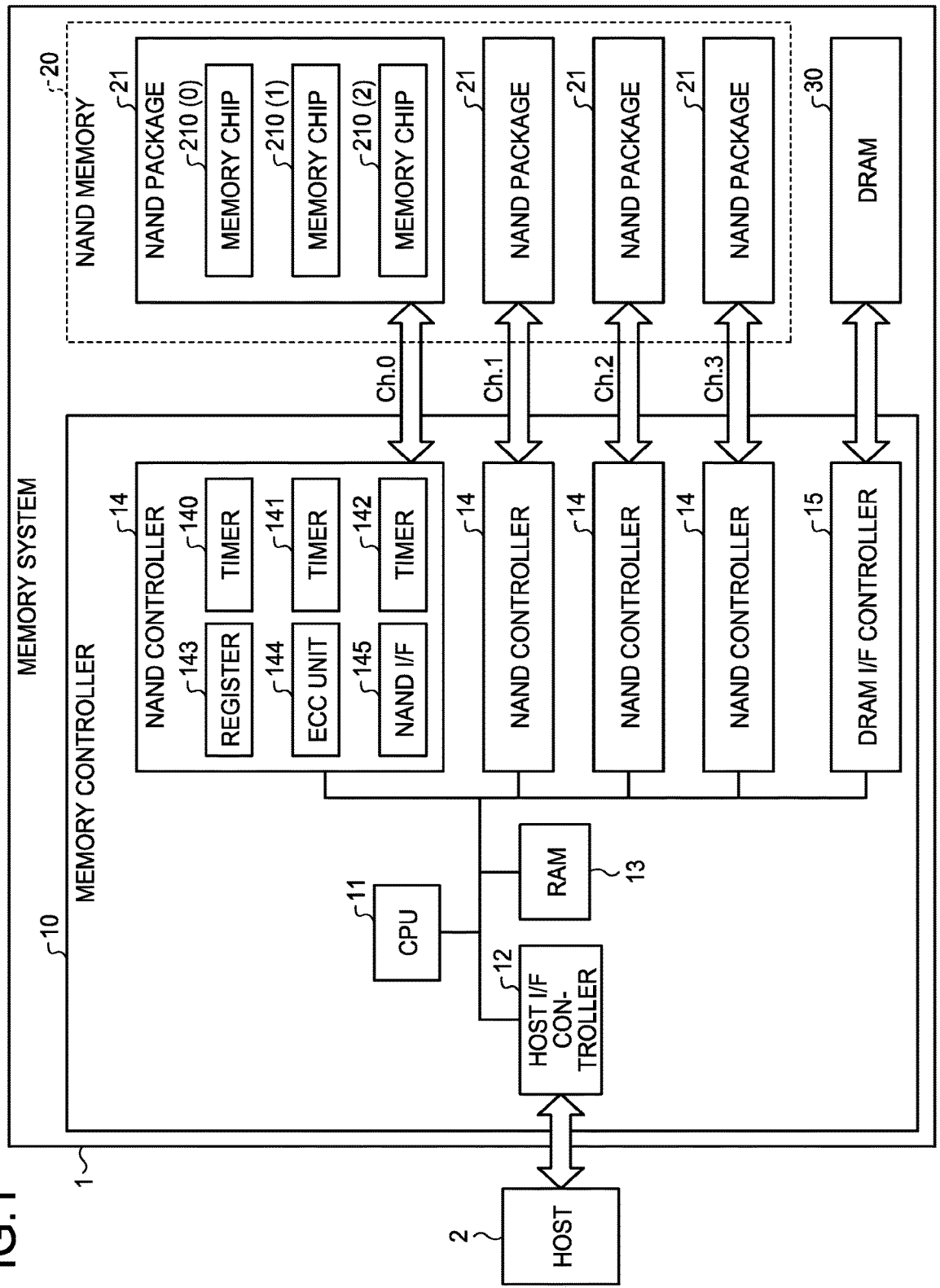
FIG. 1 is a diagram illustrating an example of a configuration of a memory system according to an embodiment.

FIG. 1 is a diagram illustrating an example of a configuration of a memory system according to an embodiment. As illustrated in FIG. 1, the memory system 1 includes a memory controller 10, a NAND flash memory 20 (hereinafter, referred to as NAND memory 20), and a dynamic random access memory (DRAM) 30.

The NAND memory 20, which is a non-volatile memory, includes a plurality of NAND packages 21. Each NAND package 21 includes a plurality of memory chips 210 (0) to 210 (2). The memory chips 210 (0) to 210 (2), which are parallel operation elements, are non-volatile memories that store data in a non-volatile manner. The plurality of memory chips 210 (0) to 210 (2) is operated independently of each other, and the plurality of memory chips 210 (0) to 210 (2) can be operated in parallel.

The number of NAND packages 21 included in the NAND memory 20 in the memory system 1 is not limited. Further, the number of memory chips 210 (0) to 210 (2) included in the NAND package 21 is not limited.

In the following, the NAND memory 20 will be described as an example, but the non-volatile memory is not limited thereto and may be another memory such as a magnetoresistive random access memory (MRAM), a phase change random access memory (PCRAM), or a resistive random access memory (ReRAM).

The DRAM 30 is a volatile memory capable of temporarily storing data. The volatile memory included in the memory system 1 is not limited to the DRAM. The memory system 1 may include, for example, a static random access memory (SRAM) as the volatile memory.

The memory controller 10 is an integrated circuit (IC) such as a system on a chip (SoC), a field programmable gate array (FPGA), or an application specific integrated circuit (ASIC), and can instruct the NAND memory 20 and the DRAM 30 to perform various operations. The memory controller 10 performs an operation based on a request from an external host 2 and an operation that is irrelevant to the request from the host 2. Each function of the memory controller 10 may be implemented by a central processing unit (CPU) that executes a program or may be implemented by dedicated hardware.

The memory controller 10 includes a CPU 11, a host interface (I/F) controller 12, a RAM 13, a plurality of NAND controllers 14, and a DRAM I/F controller 15.

The CPU 11 controls an overall operation of the memory controller 10. The CPU 11 issues a read command in response to, for example, a read request received from the host 2, and transmits the issued read command to the NAND controller 14.

The RAM 13 is a storage area used as a work area of the CPU 11. The RAM 13 stores, for example, parameters for managing the NAND memory 20 or various management tables. The RAM 13 stores, for example, a queue (command queue) of requests received from the host 2. The RAM 13 also stores an address conversion table for converting a logical address associated with data stored in the NAND memory 20 into a physical address of the NAND memory 20 in which the data is stored. The address conversion table is stored in, for example, the NAND memory 20, and is read when the memory system 1 is started up, and then is stored in the RAM 13. A volatile memory such as an SRAM is used as the RAM 13. In a case where a data size of the address conversion table is large, the address conversion table may be stored in the DRAM 30 having a larger capacity than the RAM 13.

The host I/F controller 12 is connected to the host 2 and controls communication between the memory system 1 and the host 2. The host I/F controller 12 controls transferring of data, a request, and an address between the memory system 1 and the host 2, for example. The host I/F controller 12 supports communication interface standards such as serial advanced technology attachment (SATA), serial attached SCSI (SAS), PCI express (PCIe), and non-volatile memory express (NVMe) (registered trademark). That is, examples of the host 2 connected to the memory system 1 include a computer having interfaces such as SATA, SAS, PCIe, and NVMe.

The DRAM I/F controller 15 is connected to the DRMA 30 and controls communication between the memory controller 10 and the DRAM 30. The DRAM I/F controller 15 is configured based on a DRAM interface standard. Note that the configuration of the DRAM I/F controller 15 is not limited thereto, and can be changed based on the type of the volatile memory included in the memory system 1.

The NAND controllers 14 are connected to different NAND packages 21 via different channels Ch.0 to Ch.3, respectively. Each of the channels Ch.0 to Ch.3 is constituted by a wiring group including an input/output signal line and a control signal line. The input/output signal line is a signal line for transmitting and receiving, for example, data, an address, and a command. The control signal line is a signal line for transmitting and receiving, for example, a control signal for controlling the NAND memory 20.

The NAND controllers 14 control the different channels Ch.0 to Ch.3, respectively. As a result, the NAND controllers 14 each control the command from the CPU 11 for each of memory chips 210 (0) to 210 (2) included in a corresponding NAND package 21.

Each NAND controller 14 includes a timer 140, a timer 141, a timer 142, a register 143, an ECC unit 144, and a NAND I/F 145.

The timers 140 to 142 can measure operation periods related to various operations of the memory system 1. For example, information regarding operation periods of a plurality of memory chips 210 (0) to 210 (2), which are operated in parallel, is given to the timers 140 to 142, and the timers 140 to 142 can measure the operation periods.

The number of timers 140 to 142 is not limited, but for example, the number may be equal to or more than the number of commands that the memory controller 10 can issue in one interleave operation. The interleave operation is to issue a command to each of the memory chips 210 (0) to 210 (2), which can perform parallel processing, to cause the memory chips 210 (0) to 210 (2) to be operated in parallel. The number of commands that the memory controller 10 can issue in one interleave operation depends on resources of the memory controller 10, such as the capacity of the DRAM 30. Hereinafter, it is assumed that the number of commands that the memory controller 10 can issue in one interleave operation is three.

Note that the number of timers 140 to 142 may be equal to or more than the number of parallel operation elements such as the memory chips 210 (0) to 210 (2).

The register 143 stores the operation periods associated with various operations of the memory system 1. The register 143 stores, for example, information regarding the operation periods of the memory chips 210 (0) to 210 (2), which are operated in parallel.

The ECC unit 144 encodes and decodes data to perform error detection and error correction on the data. Specifically, the ECC unit 144 encodes data to be written in the NAND memory 20. Further, the ECC unit 144 decodes data read from the NAND memory 20. The ECC unit 144 performs error detection and error correction on the read data by decoding. In a case where the error correction fails, the ECC unit 144 notifies the CPU 11 of the error correction failure. For the encoding and decoding performed by the ECC unit 144, any algorithm using a Reed-Solomon (RS) code, a Bose-Chaudhuri-Hocquenghem (BCH) code, a low density parity check (LDPC) code, and the like may be applied.

The NAND I/F 145 connects the NAND controller 14 and the NAND package 21 to each other and controls communication between the NAND controller 14 and the NAND package 21. The NAND I/F 145 is configured based on a NAND interface standard.

(Example of Configuration of Memory Chip)

Figure 2:
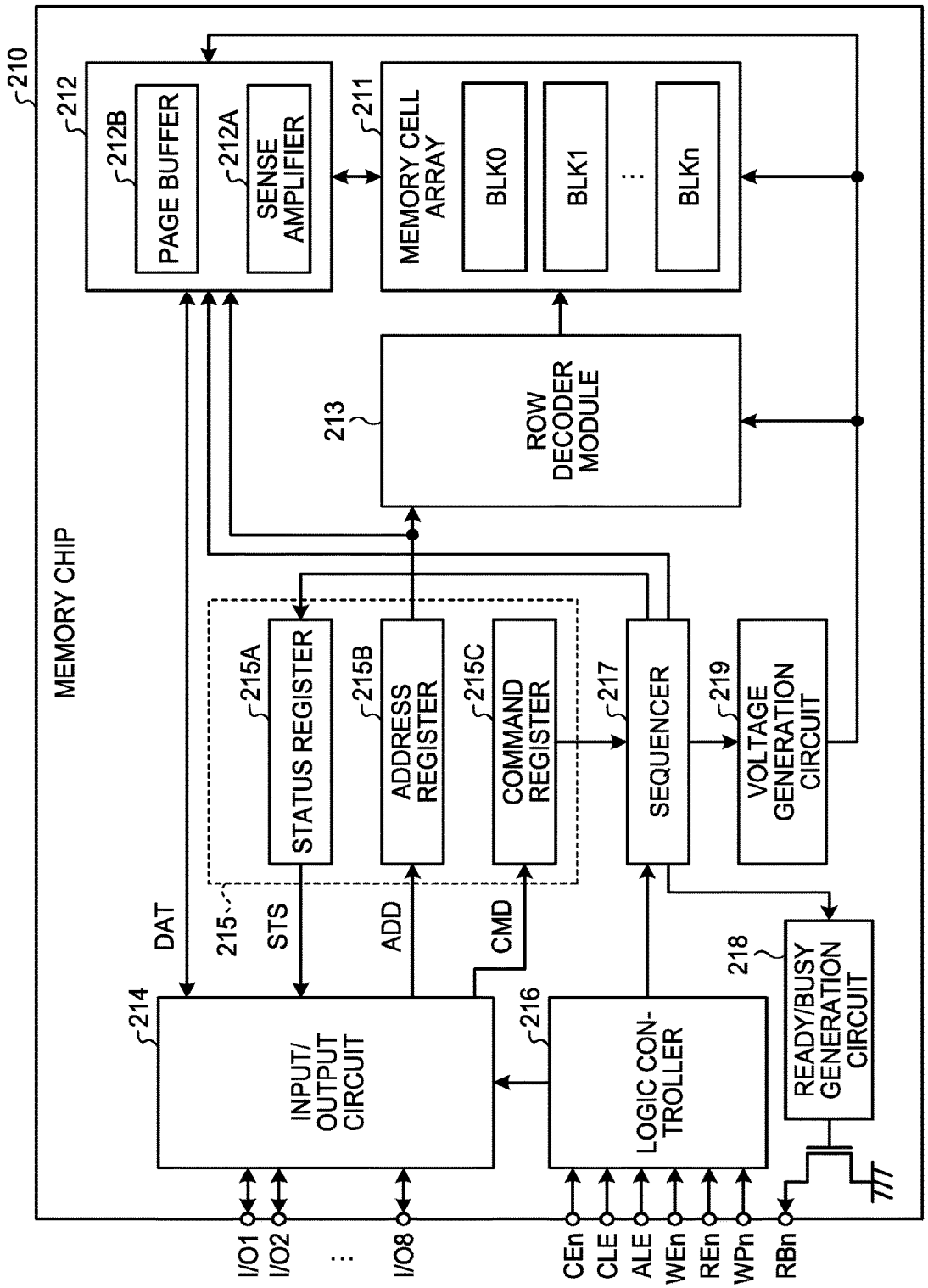
FIG. 2 is a diagram illustrating an example of a configuration of a memory chip according to the embodiment.

FIG. 2 is a diagram illustrating an example of a configuration of the memory chip 210 according to the embodiment. As illustrated in FIG. 2, the memory chip 210 includes a memory cell array 211, a sense amplifier module 212, a row decoder module 213, an input/output circuit 214, registers 215, a logic controller 216, a sequencer 217, a ready/busy generation circuit 218, and a voltage generation circuit 219.

The memory cell array 211 includes blocks BLK0 to BLKn (n is an integer of zero or more). The block BLK includes a plurality of memory cells (memory cell transistors) associated with a bit line and a word line, and serves as, for example, a unit for a data erase operation.

The blocks BLK0 to BLKn include a normal block, a ROM fuse block, and the like. Normal access from the memory controller 10 to the normal block is permitted, and writing and reading of data to and from the normal block are possible. Normal access from the memory controller 10 to the ROM fuse block is prohibited, and management information for the memory chip 210 itself is stored in the ROM fuse block. The management information stored in the ROM fuse block includes, for example, defective block information, defective column information, and information regarding an operation period of the memory chip 210.

The registers 215 include a status register 215A, an address register 215B, and a command register 215C. The status register 215A stores, for example, status information STS of the sequencer 217, and transfers the status information STS to the input/output circuit 214 based on an instruction from the sequencer 217. The status register 215A may transfer the information regarding the operation period of the memory chip 210 acquired from the ROM fuse block described above to the input/output circuit 214 based on the instruction from the sequencer 217. The address register 215B stores address information ADD transferred from the input/output circuit 214. The address information ADD includes, for example, a column address, a row address, and a block address. The column address is used by the sense amplifier module 212, and the row address and block address are used by the row decoder module 213. The command register 215C stores a command CMD transferred from the input/output circuit 214.

The sense amplifier module 212 includes a sense amplifier 212A and a page buffer 212B. When a bit line corresponding to the column address is selected, the sense amplifier 212A reads data DAT from a predetermined memory cell array 211. The page buffer 212B includes a plurality of data latches that temporarily stores the data DAT read from the memory cell array 211 or the write data DAT received from the memory controller 10 via the input/output circuit 214.

The row decoder module 213 selects a block BLK to be subjected to various operations based on the block address stored in the address register 215B. Further, the row decoder module 213 selects a word line to be subjected to various operations based on the row address stored in the address register 215B. The row decoder module 213 also transfers a voltage supplied from the voltage generation circuit 219 to the selected block BLK.

The input/output circuit 214 transmits and receives an input/output signal to and from the memory controller 10 via 8-bit input/output buses I/O (I/O1 to I/O8), for example. The input/output circuit 214 transfers, for example, the write data DAT included in the input/output signal received from the memory controller 10 to the page buffer 212B, and transmits, to the memory controller 10, the read data DAT transferred from the page buffer 212B as the input/output signal.

The logic controller 216 controls the input/output circuit 214 and the sequencer 217 based on various control signals received from the memory controller 10. As various control signals, for example, a chip enable signal CEn, a command latch enable signal CLE, an address latch enable signal ALE, a write enable signal WEn, a read enable signal REn, and a write protect signal WPn are used.

The chip enable signal CEn is a signal for enabling the memory chip 210. The command latch enable signal CLE is a signal for notifying the input/output circuit 214 that a signal input to the memory chip 210 via the input/output bus I/O is a command CMD. The address latch enable signal ALE is a signal for notifying the input/output circuit 214 that a signal input to the memory chip 210 via the input/output bus I/O is an address ADD. The write enable signal WEn is a signal that instructs the input/output circuit 214 to acquire an input/output signal. The read enable signal REn is a signal that instructs the input/output circuit 214 to output an input/output signal. The write protect signal WPn is a signal for causing the memory chip 210 to be in a protected state when, for example, a power supply is turned on/off.

The sequencer 217 controls an overall operation of the memory chip 210 based on the command CMD stored in the command register 215C. The sequencer 217 controls, for example, the sense amplifier module 212, the row decoder module 213, and the voltage generation circuit 219 to perform various operations such as a write operation and a read operation.

The ready/busy generation circuit 218 generates a ready/busy signal RBn based on an operation state of the memory chip 210. The ready/busy signal RBn is a signal that notifies the memory controller 10 whether the memory chip 210 is in a ready state in which a command from the memory controller 10 can be accepted or in a busy state in which a command cannot be accepted.

However, in the memory system 1 according to the embodiment, the memory controller 10 does not receive the ready/busy signal RBn. This enables the number of pins in the memory controller 10, which includes the plurality of channels Ch.0 to Ch.3, to be reduced. In the memory controller 10, as will be described later, a status of the memory chip 210, such as whether the memory chip 210 is in the ready state or the busy state is obtained with a command for reading the data of the status register 215A, such as a status read command, regardless of the ready/busy signal RBn. Note that the command for reading the data of the status register 215A can be accepted even when the memory chip 210 is in the busy state.

The voltage generation circuit 219 generates a desired voltage under the control of the sequencer 217, and supplies the generated voltage to the memory cell array 211, the sense amplifier module 212, the row decoder module 213, and the like. The voltage generation circuit 219 applies a desired voltage to each of signal lines that correspond to a selected word line and a non-selected word line, which will be described later, based on the address stored in the address register 215B, for example.

(Example of Configuration of Memory Cell Array)

Figure 3:
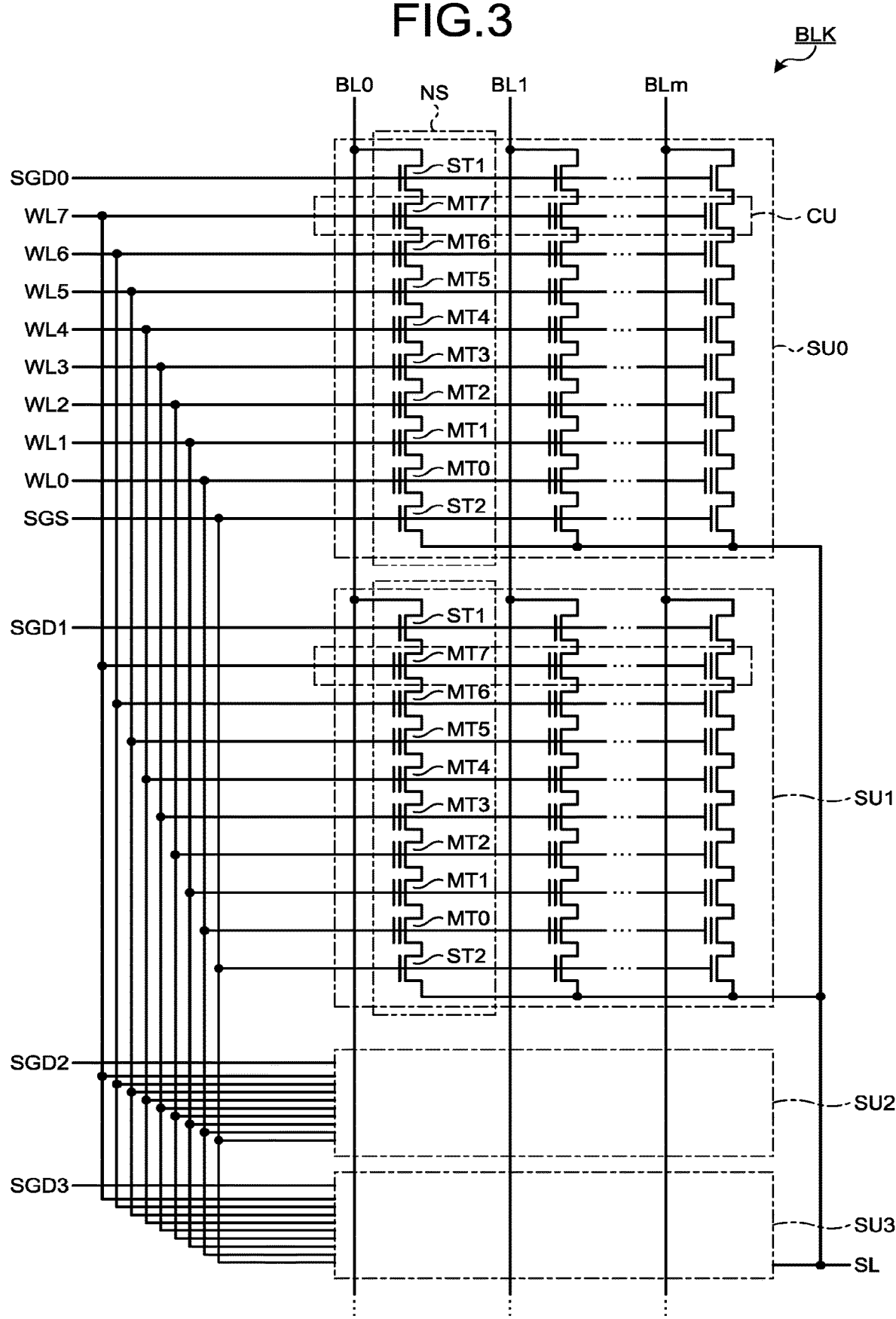
FIG. 3 is a diagram illustrating an example of a configuration of a memory cell array according to the embodiment.

FIG. 3 is a diagram illustrating an example of a configuration of the memory cell array 211 according to the embodiment. FIG. 3 illustrates a detailed circuit configuration of one block BLK in the memory cell array 211. As illustrated in FIG. 3, the block BLK includes, for example, a plurality of string units SU (here, SU0 to SU3). In the example of FIG. 3, the block BLK includes four string units SU0 to SU3, but the number of string units is not limited.

Each string unit SU includes a plurality of NAND strings NS associated with bit lines BL0 to BLm (m is an integer of zero or more), respectively. Each NAND string NS includes, for example, memory cell transistors MT0 to MT7 and select transistors ST1 and ST2. The number of memory cell transistors MT and the number of select transistors ST included in one NAND string NS are not limited.

The memory cell transistor MT includes, for example, a control gate and a charge storage layer, and stores data in a non-volatile manner. The memory cell transistors MT0 to MT7 included in the NAND string NS are connected in series between the source of the select transistor ST1 and the drain of the select transistor ST2. The control gates of the memory cell transistors MT0 of the respective NAND strings NS included in the same block BLK are commonly connected to a word line WL0. Similarly, the control gates of the memory cell transistors MT1 to MT7 of the plurality of NAND strings NS included in the same block BLK are commonly connected to word lines WL1 to WL7, respectively.

Note that, in the following description, a plurality of memory cell transistors MT connected to the same word line WL in the respective string units SU will be referred to as a cell unit CU. Further, a group of 1 bit of data stored in each memory cell transistor MT included in the cell unit CU will be referred to as a page. Therefore, in a case where 1 bit of data is stored in one memory cell transistor, the cell unit CU stores data of one page. Further, in a case where 2 bits of data are stored in one memory cell transistor, the cell unit CU stores data of two pages.

The select transistors ST1 and ST2 are used to select a string unit SU during various operations such as a read operation and a write operation. The drains of the select transistors ST1 included in the NAND strings NS corresponding to the same column address are commonly connected to a corresponding bit line BL. The gates of the plurality of select transistors ST1 included in the string unit SU0 are commonly connected to a select gate line SGD0. Similarly, the gates of the plurality of select transistors ST1 included in the string units SU1 to SU3 are commonly connected to select gate lines SGD1 to SGD3, respectively. In the same block BLK, the sources of the plurality of select transistors ST2 are commonly connected to one source line SL. The gates of the plurality of select transistors ST2 are commonly connected to one select gate line SGS.

In such a circuit configuration of the memory cell array 211, word lines WL0 to WL7 are provided for each block BLK. The bit lines BL0 to BLm are shared by a plurality of blocks BLK. The source line SL is shared by a plurality of blocks BLK. Note that the number of word lines WL and the number of select gate lines SGD and SGS are changed based on the number of memory cell transistors MT and the number of select transistors ST1 and ST2, respectively.

(Threshold Voltage Distribution of Memory Cell Transistors)

Figure 4:
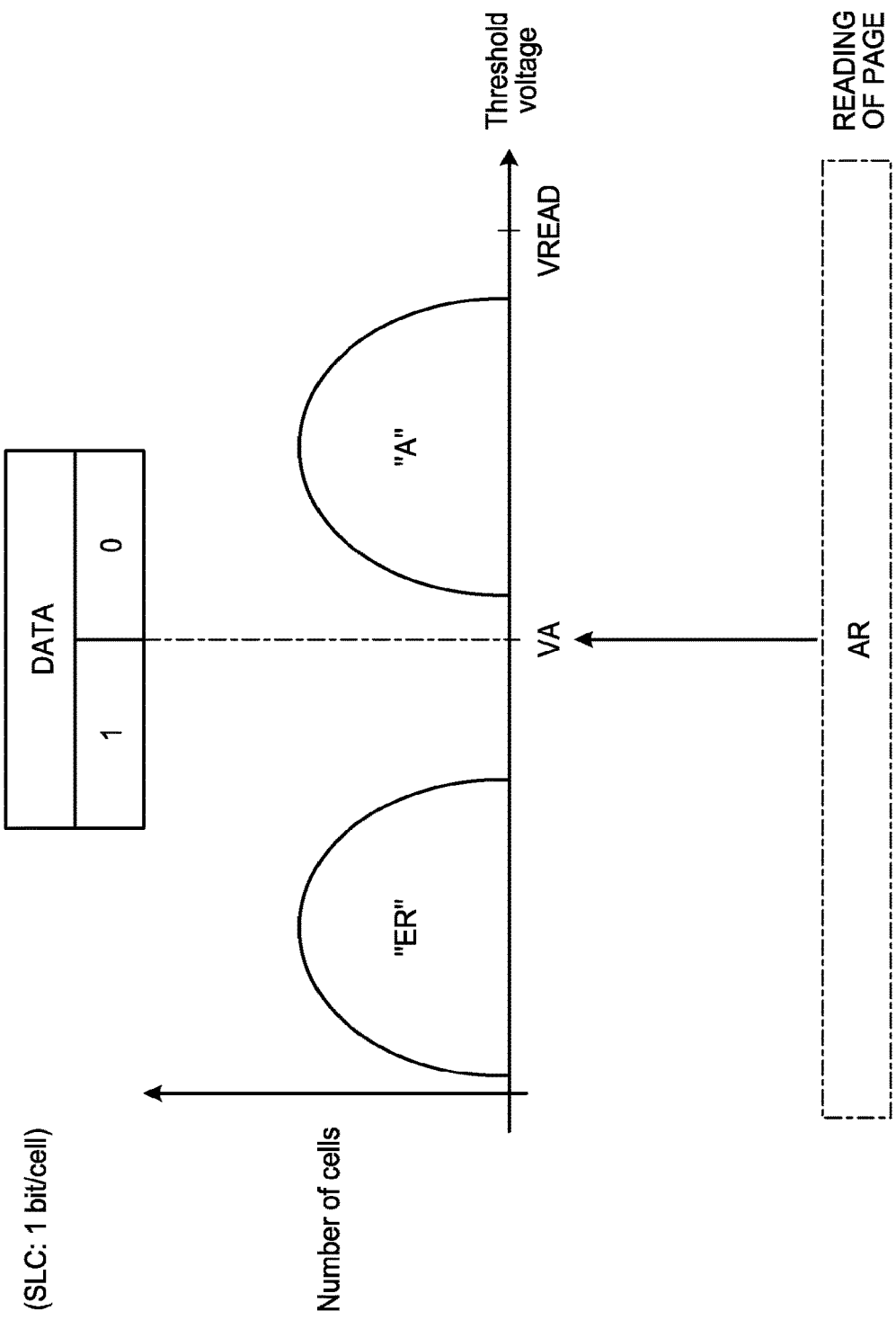
FIG. 4 is a diagram illustrating threshold voltage distributions of a plurality of memory cell transistors in the memory cell array according to the embodiment, and a read voltage.
Figure 5:
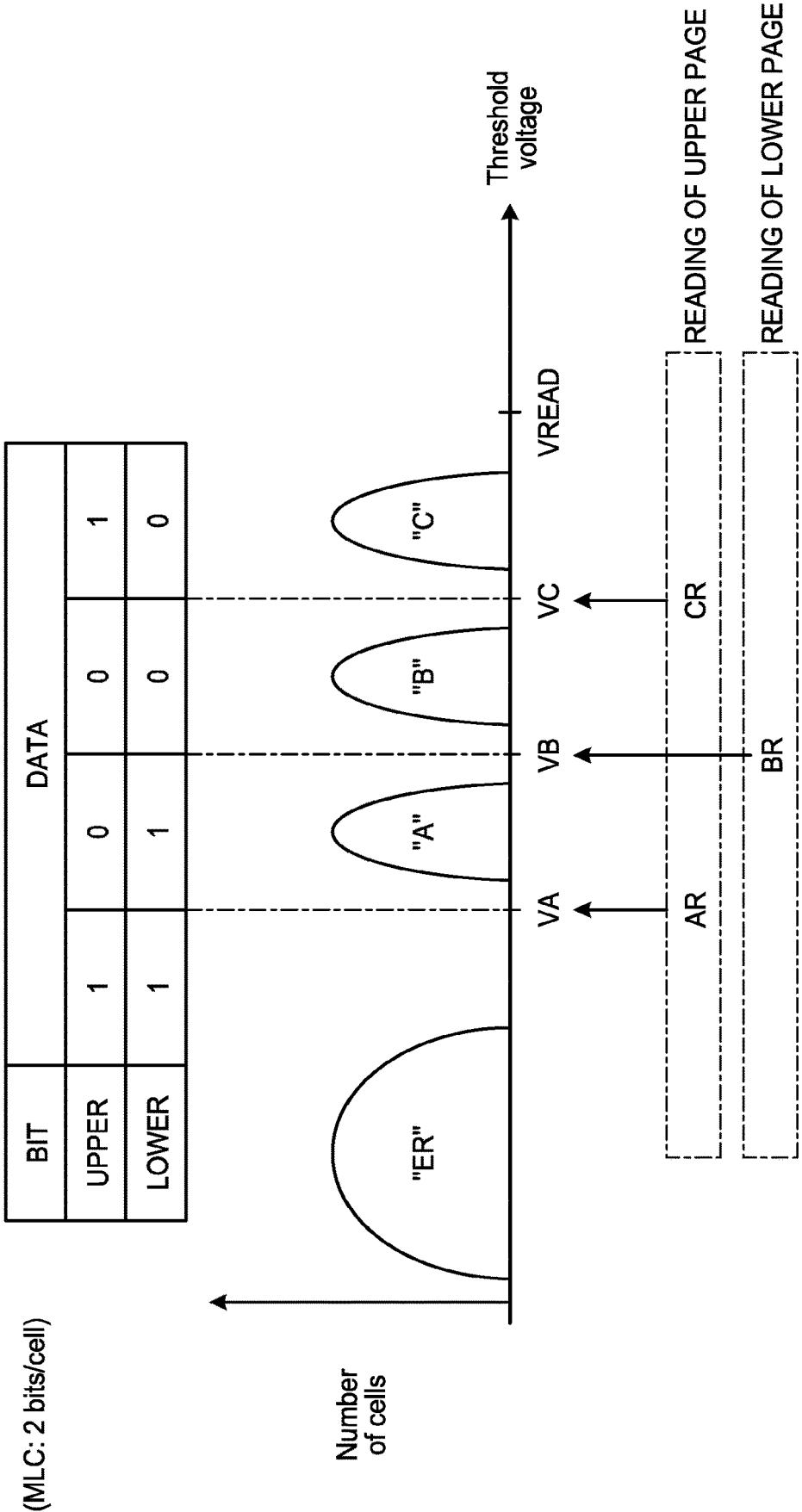
FIG. 5 is a diagram illustrating other threshold voltage distributions of the plurality of memory cell transistors in the memory cell array according to the embodiment, and read voltages.
Figure 6:
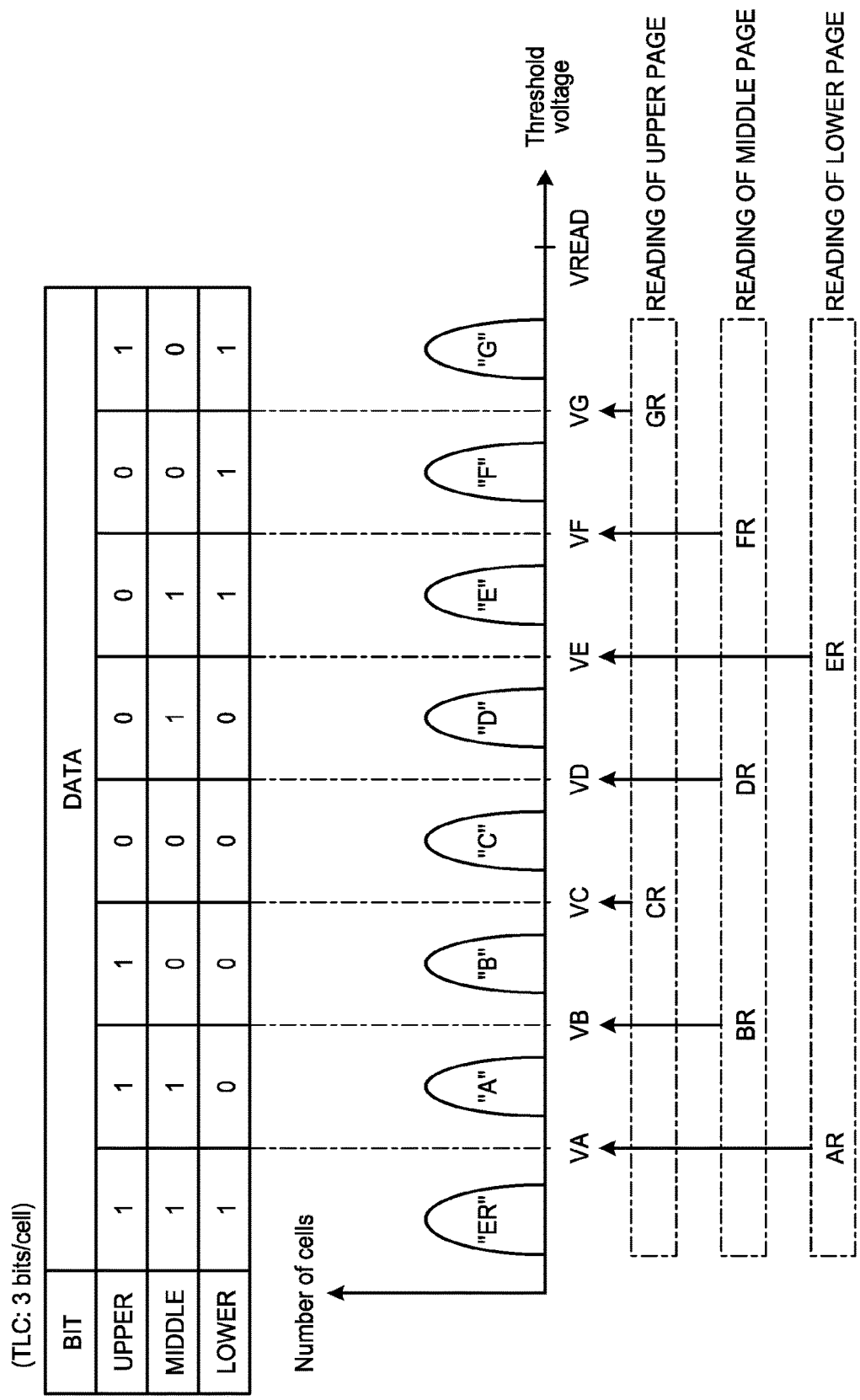
FIG. 6 is a diagram illustrating still other threshold voltage distributions of the plurality of memory cell transistors in the memory cell array according to the embodiment, and read voltages.

FIGS. 4 to 6 are diagrams illustrating threshold voltage distributions of the plurality of memory cell transistors MT in the memory cell array 211 according to the embodiment, and read voltages. FIGS. 4 to 6 illustrate threshold voltage distributions of the memory cell transistors MT according to different write modes, respectively. In FIGS. 4 to 6, a vertical axis represents the number of memory cell transistors MT and a horizontal axis represents a threshold voltage Vth of the memory cell transistors MT. As illustrated in FIGS. 4 to 6, the plurality of memory cell transistors MT forms a plurality of threshold voltage distributions in accordance with the number of bits of data to be stored in a memory cell transistor.

FIG. 4 illustrates threshold voltage distributions formed by threshold voltages of a plurality of memory cell transistors MT in a case of a single-level cell (SLC) mode in which one memory cell transistor MT stores 1 bit of data. As illustrated in FIG. 4, in the case of the SLC mode, the plurality of memory cell transistors MT forms two threshold voltage distributions. The two threshold voltage distributions will be referred to as an "ER" state and an "A" state, respectively, in an order from the lowest threshold voltage. In the SLC mode, for example, "1" data and "0" data are allocated to the "ER" state and the "A" state, respectively.

FIG. 5 illustrates threshold voltage distributions formed by threshold voltages of a plurality of memory cell transistors MT in a case of a multi-level cell (MLC) mode in which one memory cell transistor MT stores 2 bits of data. As illustrated in FIG. 5, in the case of the MLC mode, the plurality of memory cell transistors MT forms four threshold voltage distributions. The four threshold voltage distributions will be referred to as an "ER" state, an "A" state, a "B" state, and a "C" state, respectively, in an order from the lowest threshold voltage. In the MLC mode, for example, "11 (upper/lower)" data, "01" data, "00" data, and "10" data are allocated to the "ER" state, the "A" state, the "B" state, and the "C" state, respectively.

FIG. 6 illustrates threshold voltage distributions formed by threshold voltages of a plurality of memory cell transistors MT in a case of a triple-level cell (TLC) mode in which one memory cell transistor MT stores 3 bits of data. As illustrated in FIG. 6, in the case of the TLC mode, the plurality of memory cell transistors MT forms eight threshold voltage distributions. The eight threshold voltage distributions are referred to as an "ER" state, an "A" state, a "B" state, a "C" state, a "D" state, an "E" state, an "F" state, and a "G" state, respectively, in an order from the lowest threshold voltage. In the TLC mode, for example, "111 (upper/middle/lower)" data, "110" data, "100" data, "000" data, "010" data, "011" data, "001" data, and "101" data are allocated to the "ER" state, the "A" state, the "B" state, the "C" state, the "D" state, the "E" state, the "F" state, and the "G" state, respectively.

In these threshold voltage distributions, a read voltage is set between adjacent threshold voltage distributions. For example, a read voltage AR is set between the highest threshold voltage in the "ER" state and the lowest threshold voltage in the "A" state. The read voltage AR is used for an operation of determining whether a threshold voltage of a memory cell transistor MT to be read is included in the threshold voltage distribution of the "ER" state or the threshold voltage distribution of the "A" state or higher. When the read voltage AR is applied to the memory cell transistor MT to be read, the memory cell transistor MT corresponding to the "ER" state is turned on, and the memory cell transistor MT corresponding to the "A" state, "B" state, "C" state, "D" state, the "E" state, the "F" state, or the "G" state is turned off. Other read voltages are similarly set.

That is, a read voltage BR is set between the threshold voltage distribution of the "A" state and the threshold voltage distribution of the "B" state. A read voltage CR is set between the threshold voltage distribution of the "B" state and the threshold voltage distribution of the "C" state. A read voltage DR is set between the threshold voltage distribution of the "C" state and the threshold voltage distribution of the "D" state. A read voltage ER is set between the threshold voltage distribution of the "D" state and the threshold voltage distribution of the "E" state. A read voltage FR is set between the threshold voltage distribution of the "E" state and the threshold voltage distribution of the "F" state. A read voltage GR is set between the threshold voltage distribution of the "F" state and the threshold voltage distribution of the "G" state.

Further, in each write mode, a read pass voltage VREAD is set to a voltage higher than the highest threshold voltage in the highest threshold voltage distribution. As a result, a memory cell transistor MT having a gate to which the read pass voltage VREAD is applied is turned on regardless of data stored therein. Note that the read pass voltage VREAD of the MLC mode may be set higher than the read pass voltage VREAD of the SLC mode. Similarly, the read pass voltage VREAD of the TLC mode may be set higher than the read pass voltage VREAD of the MLC mode.

Here, periods for read operations (sense operation periods to be described later) required for the respective write modes, which includes the SLC mode, MLC mode, and TLC mode, are different from each other. The sense operation period of the MLC mode is longer than that of the SLC mode, and the sense operation period of the TLC mode is longer than that of the MLC mode.

The sense operation period differs depending on a page to be read. One read level (AR) is used for a read operation in the SLC mode. One read level (BR) is used for a read operation of a lower page in the MLC mode. Two read levels (AR and CR) are used for a read operation of an upper page in the MLC mode. Two read levels (CR and GR) are used for a read operation of an upper page in the TLC mode. Two read levels (AR and ER) are used for a read operation of a lower page in the TLC mode. Three read levels (BR, DR, and FR9) are used for a read operation of a middle page in the TLC mode. As such, as the number of read levels used for a read operation increases, the sense operation period also increases.

The smaller the margin of the threshold voltage distribution between adjacent states, the more easily it is affected by noise and the like, and thus the sense operation period tends to increase. Specifically, since the margin between states satisfies a relationship that SLC mode>MLC mode>TLC mode, the sense operation period for one read level satisfies a relationship that SLC mode<MLC mode<TLC mode.

The number of bits of data stored in one memory cell transistor MT and the allocation of data to each of the threshold voltage distributions described above are just examples. Various data allocations other than the above may be applied to the threshold voltage distributions. Further, each of the read voltage and the read pass voltage may be set to the same voltage value or different voltages for different write modes. Further, the encoding of bit assignment of the lower page/upper page in the MLC mode described above is merely an example. Similarly, the encoding of bit assignment of the lower page/middle page/upper page in the TLC mode is merely an example. Other encodings are also applicable, and in this case, the relation of the length of the sense operation period between respective pages may be different.

(Outline of Read Operation)

Next, an outline of the read operation will be described with reference to FIGS. 7 and 8.

Figure 7:
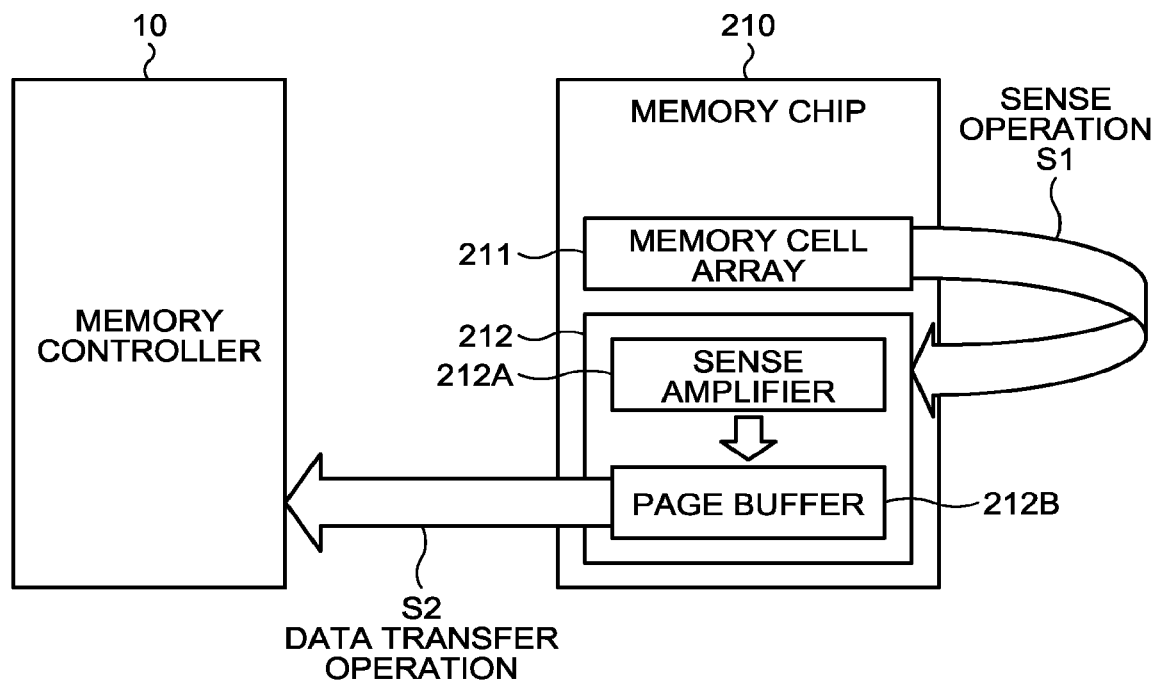
FIG. 7 is a diagram illustrating an outline of a read operation in the memory system according to the embodiment.

FIG. 7 is a diagram illustrating an outline of the read operation in the memory system 1 according to the embodiment. As illustrated in FIG. 7, the read operation includes two operations, a sense operation S1 and a data transfer operation S2.

The sense operation S1 is an operation in which the sense amplifier module 212 reads data stored in the memory cell array 211. The data transfer operation S2 is an operation of transferring the data read by the sense amplifier module 212 (more specifically, stored in the page buffer 212B) to the memory controller 10 via the input/output bus I/O.

Now the sense operation S1 is described in detail. The sequencer 217 applies a read voltage to a word line WL (i.e., selected word line WL) connected to a memory cell transistor MT to be read, and applies a read pass voltage VREAD to word lines WL (i.e., non-selected word lines WL) connected to memory cell transistors MT that are not to be read. Further, the sense amplifier 212A senses a current flowing through a bit line BL. In a case where the sense amplifier 212A senses that a current flows through the bit line BL, the sequencer 217 determines that a threshold voltage of the memory cell transistor MT is equal to or lower than the read voltage at that time. Further, in a case where the sense amplifier 212A senses that no current flows through the bit line BL, the sequencer 217 determines that the threshold voltage of the memory cell transistor MT is higher than the read voltage at that time. The sequencer 217 repeats this operation by the number of read levels required for a type of the page to be read, and the page buffer 212B performs logical operation to obtain page data.

Figure 8:
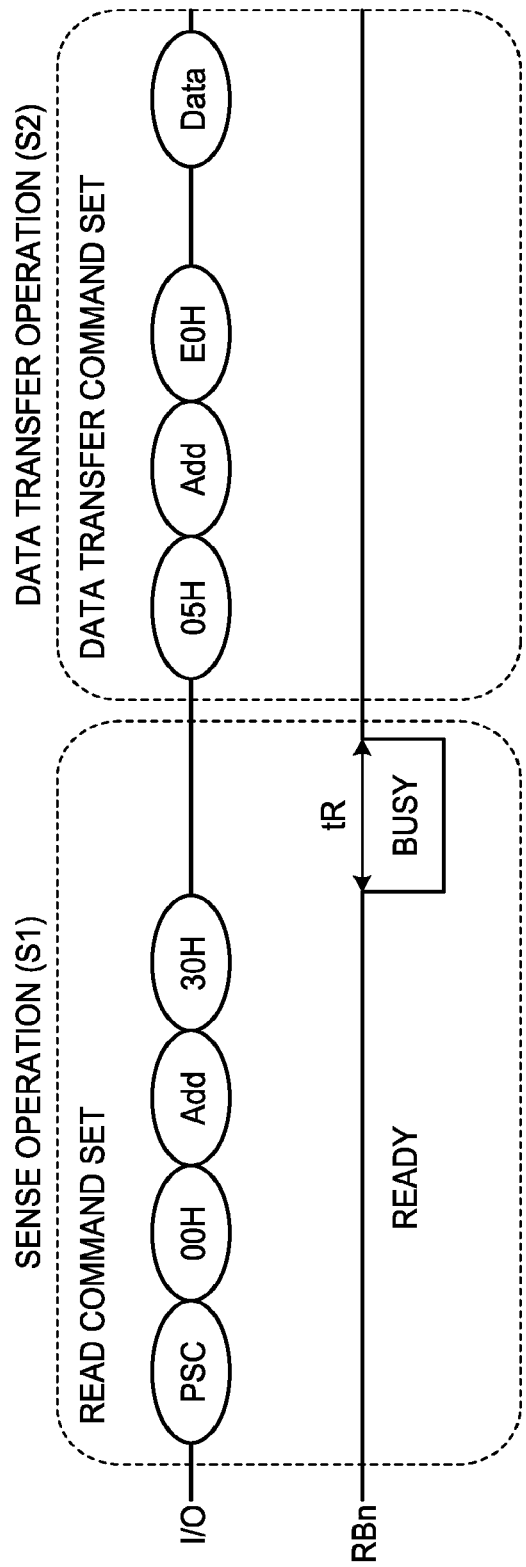
FIG. 8 is a diagram illustrating command sets for the read operation in the memory system according to the embodiment.

FIG. 8 is a diagram illustrating command sets for the read operation in the memory system 1 according to the embodiment. As illustrated in FIG. 8, the memory chip 210 starts the sense operation S1 after receiving, from the memory controller 10, a "page select command (PSC)" that specifies a page type corresponding to a physical address specified by "Add", "00H" that instructs the sense operation, "Add" that specifies a column address and a row address, and "30H" that instructs the start of data sensing. A set of these commands and addresses is also called a read command set.

The memory chip 210 transitions to the busy state when the sense operation S1 starts, and does not accept a command related to the data transfer operation from the memory controller 10. Therefore, the memory controller 10 needs to wait for the sense operation to end and the memory chip 210 to transition to the ready state before instructing the data transfer operation. As described above, a busy period for the sense operation is also referred to as tR period or sense operation period.

The memory chip 210 transitions to the ready state, once the sense operation S1 ends. The memory controller 10 determines that the memory chip 210 is in the ready state by, for example, issuing a status read command and obtaining the status of the memory chip 210.

After "05H" for instructing the data transfer, "Add" for specifying a column address and a row address, and "50H" for instructing the start of the data transfer are received from the memory controller 10, the memory chip 210 in the ready state starts the data transfer operation S2. A set of these commands and addresses is also called a data transfer command set.

As described above, the busy period (tR period) for the sense operation, that is, an operation period required for the sense operation for data varies depending on a read condition such as the write mode. Here, the read condition is, for example, at least one of the type of write mode, a page type, a row address indicating a word line to be subjected to the read operation, a word line group, or an address of the memory chip 210.

Specific examples of the write mode include the SLC mode, the MLC mode, the TLC mode, and a quadruple-level cell (QLC) mode. The QLC mode is a mode in which one memory cell transistor MT stores 4 bits of data, and has a lower page, a middle page, an upper page, and a top page.

The page type refers to the lower page and the middle page for the MLC mode, refers to the lower page, the middle page, and the upper page for the TLC mode, and refers to the lower page, the middle page, and the upper page, and the top page for the QLC mode.

The word line group is a concept that treats a plurality of word lines as one group. For example, the word lines WL0 to WL3 are grouped into a word line group WGP1, and the word lines WL4 to WL8 are grouped into a word line group WGP2.

A difference in sense operation period for each read condition as described above is stored in, for example, the ROM fuse block described above. The information regarding the sense operation period is stored in the ROM fuse block, for example at the time of shipping the memory system 1. The information regarding the sense operation period stored in the ROM fuse block is read to, for example, the status register 215A in the memory chip 210 when the memory system 1 is started up, and is set in the register 143 in the NAND controller 14 from the status register 215A. In addition, at the time of shipping the memory system 1, the sense operation period for each read condition may be measured by initial diagnosis. The sense operation period at this time may be set in the register 143 of the NAND controller 14.

The sense operation period for each read condition varies among the memory chips 210. Even in such a case, it is possible to reduce the capacity of the ROM fuse block, for example by storing only the longest period that is an operation period of a memory chip 210 that requires the longest period for the sense operation for each read condition into the status register 215A and the register 143.

(Details of Read Operation)

Figure 9:
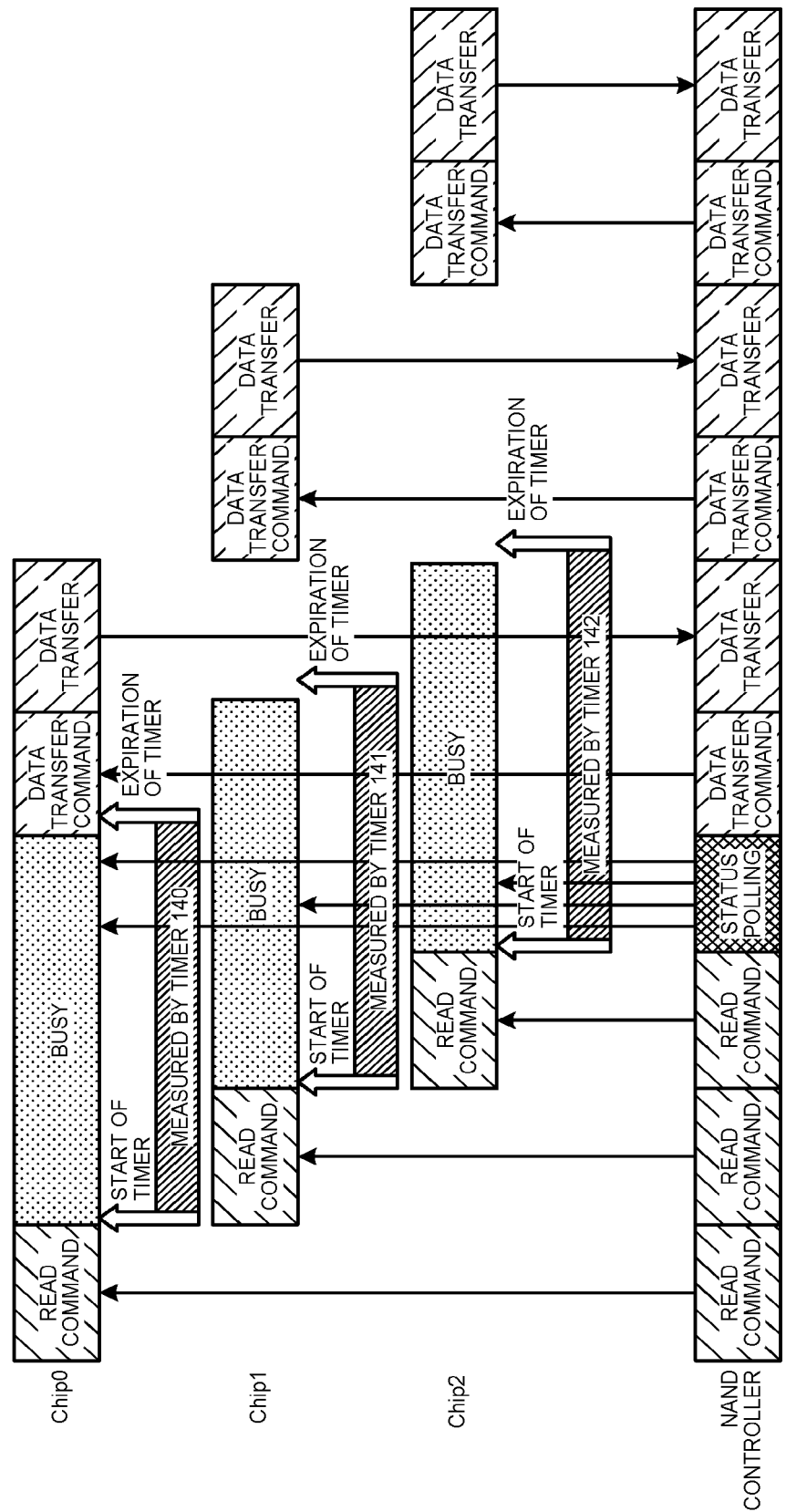
FIG. 9 is a diagram illustrating details of the read operation in the memory system according to the embodiment.

Next, details of the read operation will be described with reference to FIG. 9. FIG. 9 is a diagram illustrating details of the read operation in the memory system 1 according to the embodiment.

A NAND controller illustrated in FIG. 9 is, for example, the NAND controller 14 connected to one NAND package 21 through the channel Ch.0 illustrated in FIG. 1. Chips 0 to 2 illustrated in FIG. 9 are, for example, the memory chips 210 (0) to 210 (2) included in the NAND package 21 connected to the channel Ch.0 illustrated in FIG. 1.

In addition, the register 143 of the NAND controller 14 is assumed to have obtained information regarding the sense operation period from, for example, the status register 215A of each memory chip 210 included in the NAND package 21 and have stored the information regarding the sense operation period.

As illustrated in FIG. 9, the NAND controller 14 performs an interleave operation of causing one memory chip 210 connected to one channel Ch.0 to execute a command while also causing another memory chip 210 connected to the one channel Ch.0 to execute a command. By doing so, the performance of the memory system 1 is improved.

Specifically, the NAND controller 14 transmits a read command set to, for example, the memory chip 210 (0). The memory chip 210 (0) starts to sense data of a specified page of memory cell transistors MT that correspond to a specified physical address, and is brought into the busy state. On the other hand, the NAND controller 14 sets the longest sense operation period for the specified page type in any one of the timers 140 to 142 based on the "PSC" that specifies the page type. The "PSC" is included in the read command set. Here, the NAND controller 14 sets the sense operation period in the timer 140. The timer 140 measures the sense operation period until the set sense operation period is expired.

Once the transmission of the read command set to the memory chip 210 (0) ends, the NAND controller 14 transmits another read command set to, for example, the memory chip 210 (1). The memory chip 210 (1) starts to sense data of a specified page of memory cell transistors MT that correspond to a specified physical address, and is brought into the busy state. On the other hand, the NAND controller 14 sets the longest sense operation period for the specified page type in any one of the timers 141 and 142, except for the timer 140 that is in use, based on the "PSC" that specifies the page type. The "PSC" is included in the read command set. Here, the NAND controller 14 sets the sense operation period in the timer 141. The timer 141 measures the sense operation period until the set sense operation period is expired.

Once the transmission of the read command set to the memory chip 210 (1) ends, the NAND controller 14 transmits another read command set to the memory chip 210 (2). The memory chip 210 (2) starts to sense data of a specified page of memory cell transistors MT that correspond to a specified physical address, and is brought into the busy state.

On the other hand, the NAND controller 14 sets the longest sense operation period for the specified page type in the timer 142 that is not in use, based on the "PSC" that specifies the page type. The "PSC" is included in the read command set. The timer 142 measures the sense operation period until the set sense operation period is expired.

When all of the memory chips 210 (0) to 210 (2), the number of which corresponds to the number (three) of commands that can be issued in one interleave operation, are in the busy state, the NAND controller 14 starts a status polling operation to monitor the states of the memory chips 210 (0) to 210 (2). In the status polling operation, the NAND controller 14 sequentially issues status read commands to the memory chips 210 (0) to 210 (2), respectively. Upon receiving the status read command, the sequencer 217 of each of the memory chips 210 (0) to 210 (2) stores status information of each of the memory chips 210 (0) to 210 (2) in the status register 215A, and transfers the status information to the input/output circuit 214. As a result, the NAND controller 14 can obtain the statuses of the memory chips 210 (0) to 210 (2).

The NAND controller 14 continues the status polling operation until any one of the memory chips 210 (0) to 210 (2) is brought into the ready state or the sense operation period set in any one of the timers 140 to 142 is expired. In the example of FIG. 9, the memory chip 210 (0) becomes in the ready state before the sense operation period set in any one of the timers 140 to 142 is expired. The NAND controller 14 determines that the memory chip 210 (0) is in the ready state based on the obtained status information of the memory chip 210 (0).

When it is determined that the memory chip 210 (0) is in the ready state, the NAND controller 14 transmits a data transfer command set to the memory chip 210 (0). The memory chip 210 (0) transfers, to the NAND controller 14, the data sensed according to the read command set.

Here, in the example of FIG. 9, while the data are transferred from the memory chip 210 (0) to the NAND controller 14, the sense operation of the memory chip 210 (1) ends. Further, not long after the end of the sense operation, the set period of the timer 141 for measuring the sense operation period of the memory chip 210 (1) is expired.

Similarly, in the example of FIG. 9, while the data are transferred from the memory chip 210 (0) to the NAND controller 14, the sense operation of the memory chip 210 (2) ends, following the end of the sense operation of the memory chip 210 (1). Further, not long after the end of the data transfer from the memory chip 210 (0) to the NAND controller 14, the set period of the timer 142 for measuring the sense operation period of the memory chip 210 (2) is expired.

When the data transfer from the memory chip 210 (0) is completed, the NAND controller 14 determines that the sense operation of the memory chip 210 (1) ends and the memory chip 210 (1) is in the ready state, based on the fact that the sense operation period set in the timer 141 is expired. The NAND controller 14 transmits a data transfer command set to the memory chip 210 (1) without checking its status with a status read command. The memory chip 210 (1) transfers, to the NAND controller 14, the data sensed according to the read command set.

When the data transfer from the memory chip 210 (1) is completed, the NAND controller 14 determines that the sense operation of the memory chip 210 (2) ends and the memory chip 210 (2) is in the ready state, based on the fact that the sense operation period set in the timer 142 is expired. The NAND controller 14 transmits a data transfer command set to the memory chip 210 (2) without checking its status with a status read command. The memory chip 210 (2) transfers, to the NAND controller 14, the data sensed according to the read command set.

In this way, the read operation in the memory system 1 according to the embodiment ends.

(Example of Read Processing in Memory System)

Figure 10:
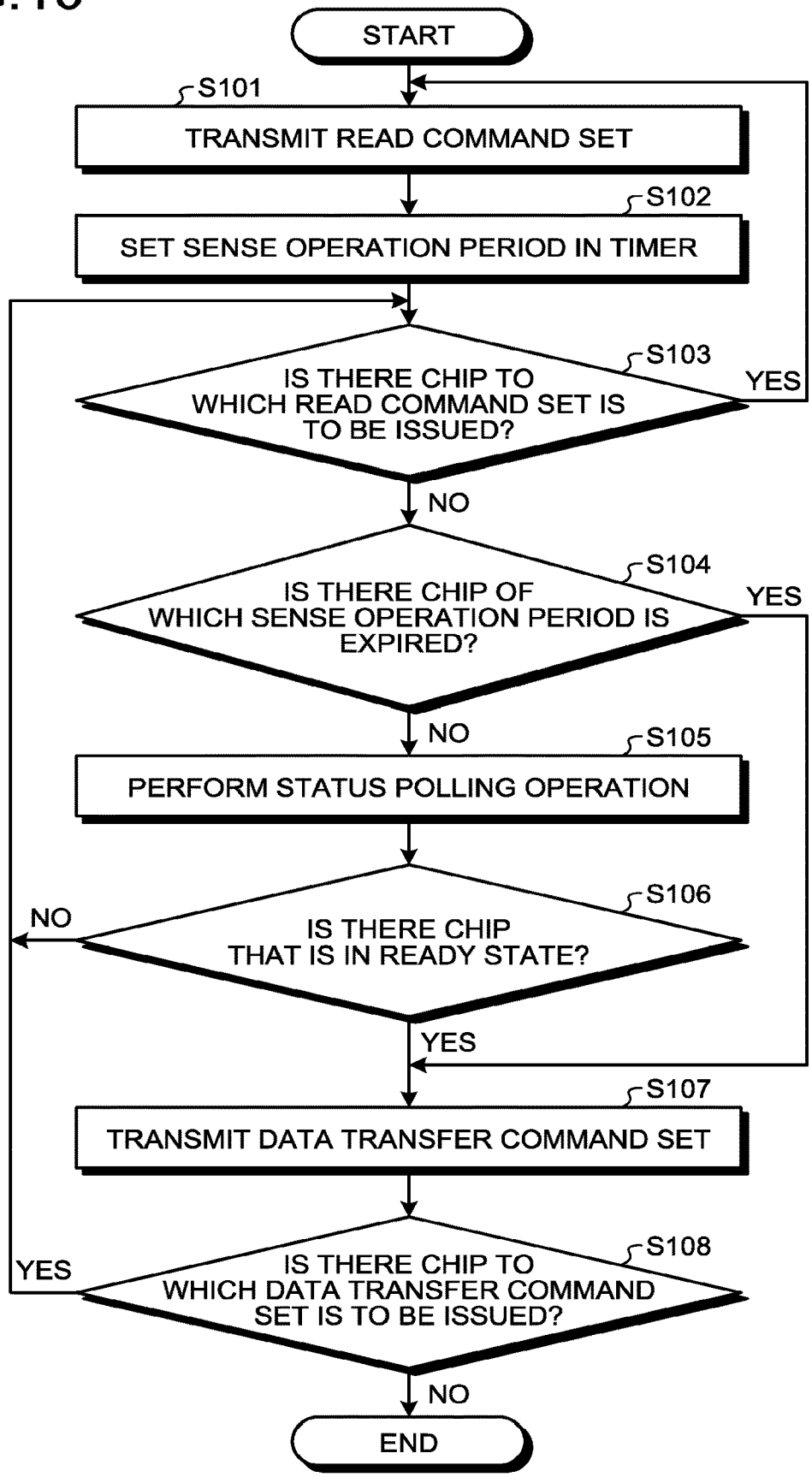
FIG. 10 is a flowchart illustrating an example of processing related to the read operation in the memory system according to the embodiment.

Next, an example of processing related to the read operation in the memory system 1 according to the embodiment will be described with reference to FIG. 10. FIG. 10 is a flowchart illustrating an example of the processing related to the read operation in the memory system 1 according to the embodiment.

As illustrated in FIG. 10, the NAND controller 14 of the memory system 1 transmits a read command set to any one of memory chips 210 (0) to 210 (2) included in a NAND package 21 that is connected to the NAND controller 14 (Step S101). Further, the NAND controller 14 sets the longest sense operation period for a specified page type in any one of the timers 140 to 142 based on specification of a page type included in the read command set transmitted by the NAND controller 14 (Step S102).

The NAND controller 14 determines whether there is another memory chip 210 to which the read command set is to be issued (Step S103). In a case where there is another memory chip 210 to which the command is to be issued (Step S103: Yes), the processing from Step S101 is repeated.

In a case where there is no other memory chip 210 to which the command is to be issued (Step S103: No), the NAND controller 14 determines, based on periods measured by the timers 140 to 142, whether there is a memory chip 210 of which a sense operation period is expired (Step S104).

In a case where there is no memory chip 210 of which a sense operation period is expired (Step S104: No), the NAND controller 14 sequentially performs a status polling operation on the memory chips 210 (0) to 210 (2) (Step S105), and determines whether there is a memory chip 210 that is in the ready state (Step S106). In a case where there is no memory chip 210 that is in the ready state (Step S106: No), the NAND controller 14 repeats the processing from Step S104.

In a case where there is a memory chip 210 of which a sense operation period is expired (Step S104: Yes), or in a case where there is a memory chip 210 that is in the ready state (Step S106: Yes), the NAND controller 14 transmits a data transfer command set to the corresponding memory chip 210 (Step S107).

The NAND controller 14 determines whether there is another memory chip 210 to which the data transfer command set is to be issued (Step S108). In a case where there is another memory chip 210 to which the command is to be issued (Step S108: Yes), the processing from Step S103 is repeated.

In a case where there is no memory chip 210 to which the command is to be issued (Step S108: No), the NAND controller 14 ends the processing.

In this way, the processing related to the read operation in the memory system 1 according to the embodiment ends.

(Comparative Example)

Figure 11:
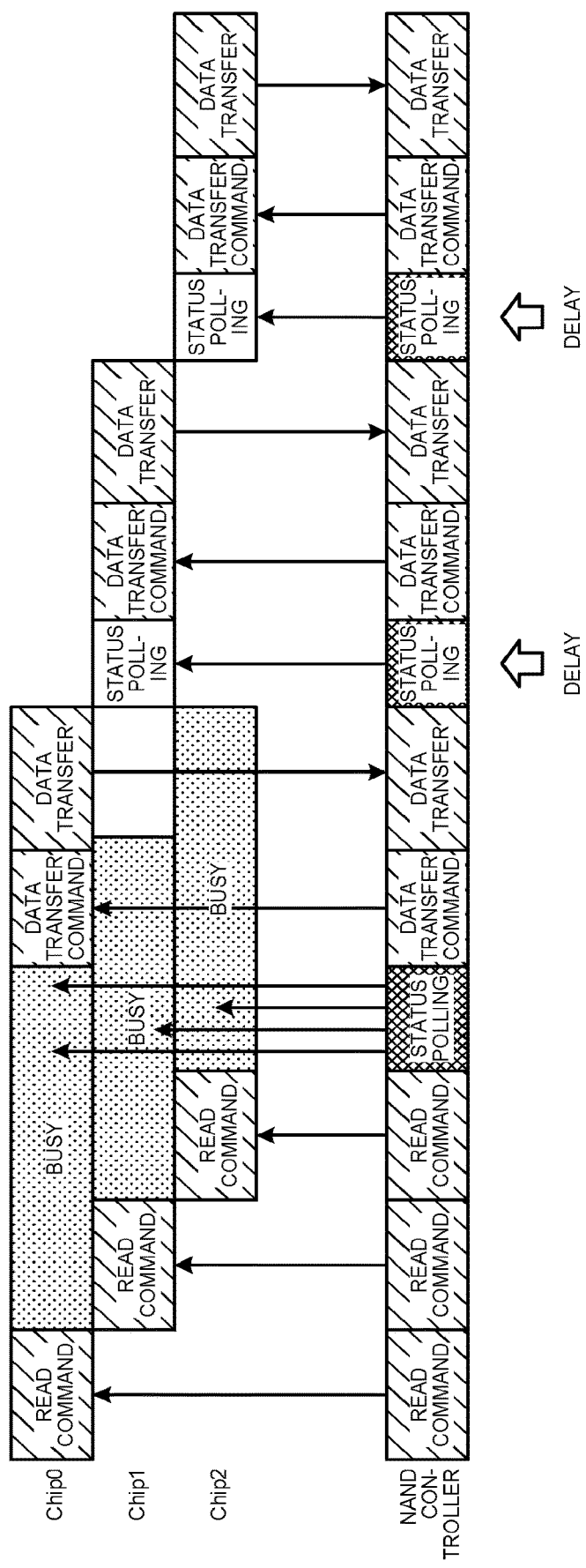
FIG. 11 is a diagram illustrating details of a read operation in a memory system according to a comparative example.

Next, a read operation in a memory system according to a comparative example will be described with reference to FIG. 11. FIG. 11 is a diagram illustrating details of a read operation in a memory system according to a comparative example. In the memory system according to the comparative example, a status of each of memory chips (0) to (2) is identified based only on a status read command.

As illustrated in FIG. 11, in the memory system according to the comparative example, a NAND controller sequentially issues a read command set to the memory chips (0) to (2), and then performs a status polling operation and waits until any one of the memory chips (0) to (2) is brought into a ready state. Then, while the NAND controller is performing data transfer from the memory chip (0) that is in the ready state, sense operations of the memory chips (1) and (2) sequentially end. However, in the memory system according to the comparative example, in order for the NAND controller to identify the statuses of the memory chips (1) and (2), it is necessary to perform a status polling operation to obtain the statuses of the memory chips (1) and (2).

After the data transfer from the memory chip (0) ends, the NAND controller identifies that the memory chip (1) is in the ready state by the status polling operation, and starts data transfer from the memory chip (1). Furthermore, after the data transfer from the memory chip (1) ends, the NAND controller identifies that the memory chip (2) is in the ready state by the status polling operation, and starts data transfer from the memory chip (2).

Here, after the data transfer from the memory chip (0) ends, a delay occurs in the read operation in the memory system according to the comparative example due to the status polling operation (i.e., due to issuance of a status read command) for the memory chip (1) and the status polling operation (i.e., due to issuance of a status read command) for the memory chip (2). The period required to check the status of the memory chip as described above is one of the causes of deterioration in performance of the memory system.

In the memory system 1 according to the embodiment, when the operation period of the sense operation of any of the plurality of memory chips 210 (0) to 210 (2) is expired, the memory controller 10 instructs the memory chip 210, of which the operation period of the sense operation is expired, to perform the data transfer operation without checking the status of the memory chip 210. As a result, the delay in the read operation due to a status polling operation can be eliminated.

In the memory system 1 of the embodiment, the operation period of the sense operation is set in any one of the timers 140 to 142 based on the read condition such as the write mode or the page type. As a result, the memory controller 10 can identify whether the operation period of the sense operation of any of the plurality of memory chips 210 (0) to 210 (2) is expired. Therefore, it is possible to determine that a memory chip 210 of which an operation period is expired is in the ready state without checking the status of the memory chip 210.

In the memory system 1 according to the embodiment, the read condition such as the write mode or the page type is included in the read command set issued by the memory controller 10. As a result, the memory controller 10 can set the operation period of the sense operation in any one of the timers 140 to 142 based on the read condition.

In the memory system 1 according to the embodiment, the memory controller 10 sets, in any one of the timers 140 to 142, the longest operation period for each read condition among the operation periods. That is, the register 143 of the NAND controller 14, the status register 215A of the memory chip 210, the ROM fuse block of the memory chip 210, and the like need not store all operation periods that vary among, for example, the memory chips 210 (0) to 210 (2), and it is possible to efficiently utilize a resource in the memory system 1. Further, even in a case where the operation period varies among the memory chips 210 (0) to 210 (2), the data transfer command set can be transmitted at an appropriate timing.

(Modified Example)

Next, a read operation according to a modified example of the embodiment will be described with reference to FIGS. 12 and 13.

In the memory system, a defect called a busy-stack phenomenon, in which a state of a memory chip is fixed to a busy state in a sense operation, might occur. In the modified example, a read operation in the memory system when the busy-stack phenomenon occurs will be described. In the following description, the memory system 1 will be taken as an example, as in the above embodiment.

Figure 12:
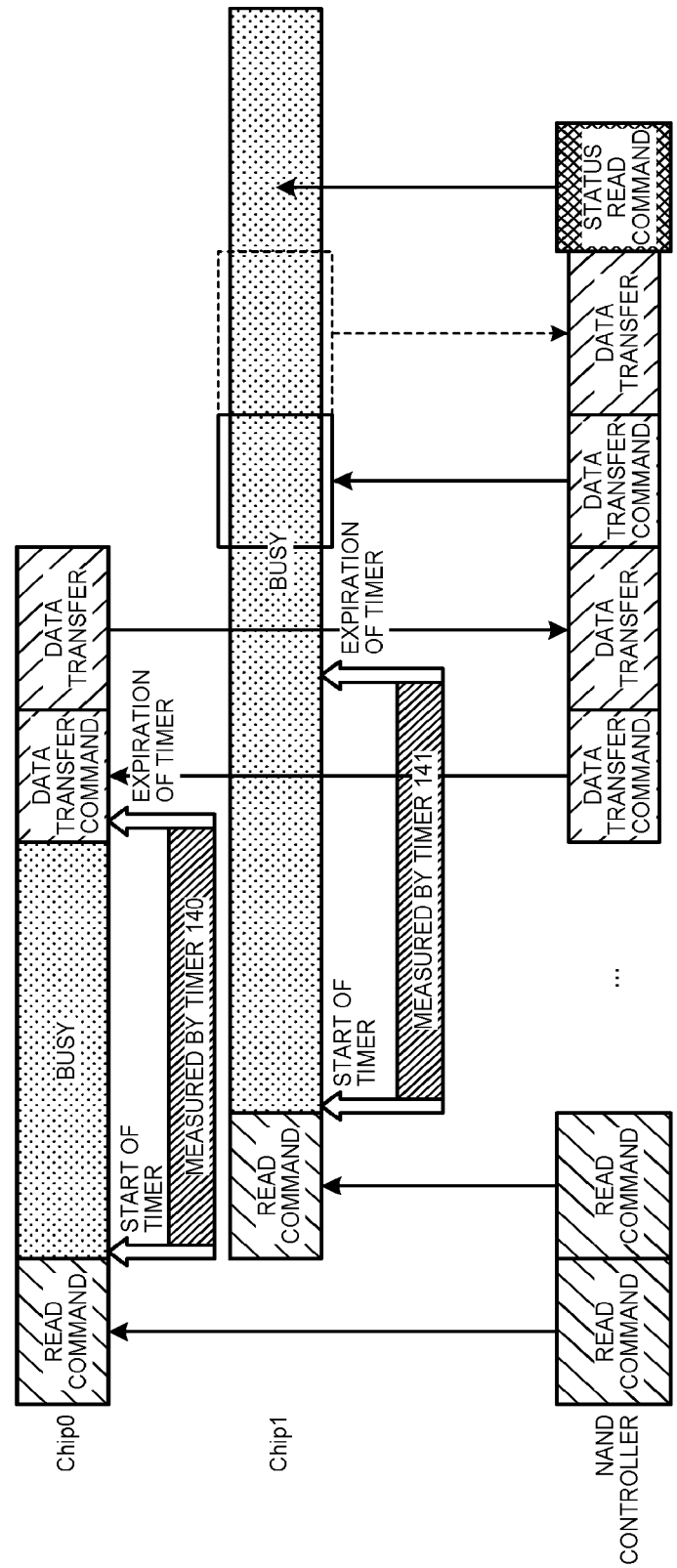
FIG. 12 is a diagram illustrating a case where a busy-stack phenomenon occurs in a read operation according to a modified example of the embodiment.

FIG. 12 is a diagram illustrating a case where the busy-stack phenomenon occurs in a read operation according to the modified example of the embodiment.

An example illustrated in FIG. 12 shows that, after the NAND controller 14 sequentially issues a read command set to the memory chips 210 (0) and 210 (1) respectively, and sets a sense operation period in each of the timers 140 and 141, and the busy-stack phenomenon occurs in the memory chip 210 (1).

Even in such a case, for example, the sense operation period set in the timer 141 by the NAND controller 14 for the memory chip 210 (1) is expired when a predetermined period elapses. In the example of FIG. 12, the sense operation period of the timer 141 is expired while the NAND controller 14 is performing data transfer from the memory chip 210 (0).

Thus, the NAND controller 14 issues a data transfer command set to the memory chip 210 (1) after the data transfer from the memory chip 210 (0) ends. However, the memory chip 210 (1) is not in a state in which the data transfer command set can be accepted, and thus valid data are not transferred from the memory chip 210 (1) to the NAND controller 14.

The ECC unit 144 included in the NAND controller 14 is a component that performs error correction on data transferred from the memory chip 210. In the above case, the ECC unit 144 determines that errors in the data from the memory chip 210 (1) cannot be corrected.

In a case where the ECC unit 144 determines that the errors cannot be corrected, the NAND controller 14 issues a status read command to the memory chip 210 (1) and checks the status of the memory chip 210 (1). In a case where the memory chip 210 (1) is in the busy state, the NAND controller 14 determines that a busy-stack phenomenon occurred in the memory chip 210 (1), and issues a reset command to the memory chip 210 (1) to reset the memory chip 210 (1).

FIG. 13 is a flowchart illustrating an example of processing when the busy-stack phenomenon occurs in the read operation according to the modified example of the embodiment. The busy-stack phenomenon can occur after, for example, the processing of Step S107 illustrated in FIG. 10 according to the above-described embodiment.

After transmitting a data transfer command set to a memory chip 210 of which a sense operation period is expired (Step S107), the NAND controller 14 checks whether the ECC unit 144 determines that error correction is failed (Step S201). In a case where the ECC unit 144 does not determine that error correction is failed (Step S201: No), the NAND controller 14 returns to the normal flow and continues processing for another memory chip 210 (Step S108).

In a case where the ECC unit 144 determines that error correction is failed (Step S201: Yes), the NAND controller 14 issues a status read command to the memory chip 210 that is a transfer source of data determined to be uncorrectable (Step S202). The NAND controller 14 obtains the status from the memory chip 210 and determines whether the memory chip 210 is in the busy state (Step S203).

In a case where the memory chip 210 is in the busy state (Step S203: Yes), the NAND controller 14 determines that the busy-stack phenomenon has occurred in the memory chip 210 and performs time-out processing. That is, the NAND controller 14 issues a reset command to the memory chip 210 (Step S204), and ends the processing for the corresponding memory chip 210. Then, the NAND controller 14 continues processing for another memory chip 210 (Step S108).

In a case where the memory chip 210 is in the ready state (Step S203: No), the NAND controller 14 determines that the busy-stack phenomenon has not occurred in the memory chip 210 and issues a retry read command to the memory chip 210 (Step S205). The retry read command is a command that causes the memory chip 210 to read the data determined by the ECC unit 144 to be uncorrectable again. Then, the NAND controller 14 repeats the processing from Step S201.

In the memory system according to the comparative example, it takes a long time until time-out determination is made, even when the busy-stack phenomenon occurs in a memory chip.

In the read operation according to the modified example, a memory chip 210 of which an operation period is expired is instructed to perform the data transfer operation without the status of the memory chip 210 being checked. As a result, when the busy-stack phenomenon occurs in the memory chip 210, error correction becomes failed in data error correction processing, such that the time-out determination can be made quickly.

In the read operation according to the modified example, when an uncorrectable error occurs in the data error correction processing, the status of the memory chip 210 that is a data transfer source is checked. This enables the memory chip 210 to perform the read operation again in a case where the error is not caused due to the busy-stack phenomenon, but caused while the memory chip 210 is in the ready state.

[Other Embodiments]

For the above-described embodiments and modified examples, the case where the parallel operation elements are the memory chips 210 (0) to 210 (2) has been described, but the parallel operation elements are not limited to the memory chips 210 (0) to 210 (2). For example, a single memory chip may include a plurality of planes each including a memory cell array and peripheral circuits such as a sense amplifier module and a row decoder module. The plurality of planes can individually operate in parallel, and in such a case, each plane corresponds to the parallel operation element. In addition, it is possible to define individual components that can operate in parallel as the parallel operation elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory that includes a plurality of parallel operation elements, each of the plurality of parallel operation elements including a memory cell, data stored in the memory cell being configured to be read out therefrom by a sense operation, the data read out from the memory cell being configured to be transmitted to outside of the non-volatile memory by a transfer operation; and
a memory controller configured to control the plurality of parallel operation elements, wherein
the memory controller is configured to:
manage operation periods that differ based on read conditions for each of the plurality of parallel operation elements, and
in reading data from the non-volatile memory,
instruct a first parallel operation element among the plurality of parallel operation elements to perform the sense operation,
start to measure a time period elapsed since instructing the first parallel operation element to perform the sense operation,
sequentially instruct other parallel operation elements than the first parallel operation element among the plurality of parallel operation elements to perform the sense operation, and
after finishing instructing the other parallel operation elements to perform the sense operation, in a case where time period elapsed since instructing the first parallel operation element to perform the sense operation exceeds the longest operation period of the managed operation periods, instruct the first parallel operation element to perform the transfer operation without checking a status of the first parallel operation element.

2. The memory system according to claim 1, wherein the plurality of parallel operation elements is connected to the memory controller via one channel.

3. The memory system according to claim 1, wherein the memory controller includes a timer configured to determine the time period elapsed since instructing the first parallel operation element to perform the sense operation.

4. The memory system according to claim 3, wherein the memory controller is configured to set different operation periods in the timer for different read conditions.

5. The memory system according to claim 3, wherein the memory controller is configured to:
issue, to each of the plurality of parallel operation elements, a read command set for instructing the sense operation, the read command set including at least a first read condition; and
set the operation period in the timer based on the first read condition specified in the read command set.

6. The memory system according to claim 5, wherein the first read condition is one of the read conditions, and the memory controller is configured to:
manage the operation period of the first read condition for each of the plurality of parallel operation elements; and
set, in the timer, a longest operation period of the managed operation periods of the first read condition of the plurality of parallel operation elements to which the read command set is issued.

7. The memory system according to claim 4, wherein each of the different read conditions includes at least one of a write mode or a page type.

8. The memory system according to claim 1, wherein the memory controller is further configured to:
perform error correction processing on the data transferred by the transfer operation, and
in a case where the error correction processing fails,
check a status of a parallel operation element that is a source of the transfer operation among the plurality of parallel operation elements; and
in a case where the status of the parallel operation element that is the source of the transfer operation is busy, issue a reset command to the parallel operation element that is the source of the transfer operation.

9. The memory system according to claim 1, wherein each of the plurality of parallel operation elements is a memory chip.

10. A method of controlling a plurality of parallel operation elements included in a non-volatile memory, each of the plurality of parallel operation elements including a memory cell, data stored in the memory cell being configured to be read out therefrom by a sense operation, the data read out from the memory cell being configured to be transmitted to outside of the non-volatile memory by a transfer operation, said method comprising:
managing operation periods that differ based on read conditions for each of the plurality of parallel operation elements, and
in reading data from the non-volatile memory,
instructing a first parallel operation element among the plurality of parallel operation elements to perform the sense operation;
starting to measure a time period elapsed since instructing the first parallel operation element to perform the sense operation;
sequentially instructing other parallel operation elements than the first parallel operation element among the plurality of parallel operation elements to perform the sense operation; and
after finishing instructing the other parallel operation elements to perform the sense operation in a case where the time period elapsed since instructing the first parallel operation element to perform the sense operation exceeds the longest operation period of the managed operation periods, instructing the first parallel operation element to perform the transfer operation without checking a status of the first parallel operation element.

11. The method according to claim 10, wherein the instruction of the sense operation and the instruction of the transfer operation are transmitted to the plurality of parallel operation elements via one channel.

12. The method according to claim 10, wherein the time period elapsed since instructing the first, parallel operation element to perform the sense operation is determined by using a timer.

13. The method according to claim 12, further comprising:
setting different operation periods in the timer for different read conditions.

14. The method according to claim 12, further comprising:
issuing a read command set for instructing the sense operation to each of the plurality of parallel operation elements, the read command set including at least a first read condition; and setting the operation period in the timer based on the first read condition specified in the read command set.

15. The method according to claim 14, further comprises:
managing the operation period of the first read condition for each of the plurality of parallel operation elements, and
setting, in the timer, the longest operation period of the managed operation periods of the first read condition of the plurality of parallel operation elements to which the read command set is issued.

16. The method according to claim 13, wherein each of the different read conditions includes at least one of a write mode or a page type.

17. The method according to claim 10, further comprising:
performing error correction processing on the data transferred by the transfer operation;
in a case where the error correction processing fails,
checking a status of a parallel operation element that is a source of the transfer operation among the plurality of parallel operation elements; and
in a case where the status of the parallel operation element that is the source of the transfer operation is busy, issuing a reset command to the parallel operation element that is the source of the transfer operation.

18. The method according to claim 10, wherein each of the plurality of parallel operation elements is a memory chip.

19. A memory system comprising:
a non-volatile memory that includes a plurality of parallel operation elements; each of the plurality of parallel operation elements including a memory cell; and
a memory controller configured to control the plurality of parallel operation elements, wherein
the memory controller is configured to:
in reading data from the non-volatile memory,
sequentially instruct the plurality of parallel operation elements to perform a sense operation of sensing data stored in the memory cell included in each of the plurality of parallel operation elements, and
in a case where an operation period of the sense operation of any one of the plurality of parallel operation elements is expired, instruct the one of the plurality of parallel operation elements to perform a transfer operation for the data without checking a status of the one of the plurality of parallel operation elements;
perform error correction processing on the data transferred by the transfer operation, and
in a case where the error correction processing fails,
check a status of a parallel operation element that is a source of the transfer operation among the plurality of parallel operation elements; and
in a case where the status of the parallel operation element that is the source of the transfer operation is busy, issue a reset command to the parallel operation element that is the source of the transfer operation.

* * * * *